United States Patent
Tu et al.

(10) Patent No.: US 11,608,410 B2
(45) Date of Patent: Mar. 21, 2023

(54) LIQUID CRYSTAL POLYMER FILM AND LAMINATE COMPRISING THE SAME

(71) Applicant: Chang Chun Plastics Co., Ltd., Taipei (TW)

(72) Inventors: An-Pang Tu, Taipei (TW); Chia-Hung Wu, Taipei (TW); Chien-Chun Chen, Taipei (TW)

(73) Assignee: CHANG CHUN PLASTICS CO., LTD., Taipei (TW)

( * ) Notice: Subject to any disclaimer, the term of this patent is extended or adjusted under 35 U.S.C. 154(b) by 43 days.

(21) Appl. No.: 17/012,105

(22) Filed: Sep. 4, 2020

(65) Prior Publication Data

US 2021/0189242 A1    Jun. 24, 2021

Related U.S. Application Data

(60) Provisional application No. 62/952,553, filed on Dec. 23, 2019.

(51) Int. Cl.

| | |
|---|---|
| *B32B 15/20* | (2006.01) |
| *B32B 15/09* | (2006.01) |
| *B32B 27/36* | (2006.01) |
| *C08G 63/06* | (2006.01) |
| *C08G 63/83* | (2006.01) |
| *C08J 5/18* | (2006.01) |
| *H05K 1/03* | (2006.01) |
| *C08G 63/60* | (2006.01) |
| *C08L 67/04* | (2006.01) |
| *C09K 19/38* | (2006.01) |
| *B29C 41/12* | (2006.01) |
| *B29D 7/01* | (2006.01) |
| *B29K 67/00* | (2006.01) |
| *B29K 105/00* | (2006.01) |

(52) U.S. Cl.
CPC ............ *C08G 63/065* (2013.01); *B29C 41/12* (2013.01); *B29D 7/01* (2013.01); *B32B 15/09* (2013.01); *B32B 15/20* (2013.01); *B32B 27/36* (2013.01); *C08G 63/06* (2013.01); *C08G 63/60* (2013.01); *C08G 63/83* (2013.01); *C08J 5/18* (2013.01); *C08L 67/04* (2013.01); *C09K 19/3809* (2013.01); *H05K 1/032* (2013.01); *B29K 2067/00* (2013.01); *B29K 2105/0079* (2013.01); *B32B 2250/03* (2013.01); *B32B 2250/40* (2013.01); *B32B 2305/55* (2013.01); *B32B 2307/538* (2013.01); *B32B 2307/704* (2013.01); *B32B 2307/732* (2013.01); *B32B 2457/08* (2013.01); *C08G 2250/00* (2013.01); *C08J 2367/04* (2013.01); *C08L 2203/16* (2013.01); *H05K 2201/0141* (2013.01)

(58) Field of Classification Search
CPC .............. B32B 15/09; B32B 2305/55; B32B 2307/704; C09K 19/3809
See application file for complete search history.

(56) References Cited

U.S. PATENT DOCUMENTS

| | | | |
|---|---|---|---|
| 5,534,209 A | 7/1996 | Moriya | |
| 5,746,949 A | 5/1998 | Shen et al. | |
| 5,998,804 A | 12/1999 | Suh et al. | |
| 6,859,241 B2 * | 2/2005 | Hamamoto | .......... G02B 5/3033 349/122 |
| 9,874,439 B2 | 1/2018 | Bucher | |
| 2002/0060309 A1 | 5/2002 | Jester | |
| 2006/0048963 A1 | 3/2006 | Nishinaka et al. | |
| 2009/0033839 A1* | 2/2009 | Fukuda | ................ G02B 5/3083 428/1.31 |
| 2014/0135469 A1 | 5/2014 | Kim et al. | |
| 2017/0347464 A1 | 11/2017 | Hashizume | |
| 2018/0147815 A1 | 5/2018 | Hashizume | |
| 2018/0230317 A1* | 8/2018 | Seo | ........................ C09D 5/006 |
| 2019/0090970 A1 | 3/2019 | Nichogi | |
| 2019/0091970 A1 | 3/2019 | Ueki | |
| 2019/0160728 A1 | 5/2019 | Higashioji | |
| 2019/0352456 A1 | 11/2019 | Hsiang et al. | |
| 2020/0407639 A1 | 12/2020 | Liao | |
| 2021/0187884 A1 | 6/2021 | Tu | |
| 2021/0189118 A1 | 6/2021 | Tu | |
| 2021/0189242 A1 | 6/2021 | Tu | |

FOREIGN PATENT DOCUMENTS

| | | |
|---|---|---|
| CN | 1235173 A | 11/1999 |
| CN | 101423652 A | 5/2009 |
| CN | 101921469 A | 12/2010 |
| CN | 102085708 A | 6/2011 |
| CN | 102574362 A | 7/2012 |
| CN | 109180979 A | 1/2019 |
| CN | 109196716 A | 1/2019 |
| CN | 110073282 A | 7/2019 |

(Continued)

OTHER PUBLICATIONS

Final Rejection of U.S. Appl. No. 16/748,846 dated Dec. 9, 2020.
Rejection of RCE of U.S. Appl. No. 16/748,846 dated Apr. 2, 2021.
Examination Report of TW109144672 dated Feb. 23, 2021.
Examination Report of TW109144673 dated Mar. 23, 2021.
Examination Report of TW109144674 dated Feb. 25, 2021.
Authors: MahaA Mekkawy et al.; Title: Comparative study of surface roughness between polyamide, thermoplastic polymethyl methacrylate and acetal resins flexible denture base materials before and after polishing; Published Date: Oct. 7, 2015.

(Continued)

*Primary Examiner* — Alicia J Sawdon

(74) *Attorney, Agent, or Firm* — WPAT, PC

(57) ABSTRACT

Provided are a liquid crystal polymer (LCP) film and a laminate comprising the same. The LCP film has a first surface and a second surface opposite each other, and a Kurtosis (Rku) of the first surface ranges from 3.0 to 60.0. With the Rku, the LCP film is able to improve the peel strength with a metal foil and ensure that a laminate comprising the same maintains the merit of low insertion loss.

14 Claims, No Drawings

(56) References Cited

FOREIGN PATENT DOCUMENTS

| | | | |
|---|---|---|---|
| CN | 112586096 A | 3/2021 | |
| EP | 3424703 A1 | 1/2019 | |
| JP | S59157115 A | 9/1984 | |
| JP | H03017156 A | 1/1991 | |
| JP | H05-214253 A | 8/1993 | |
| JP | H06-240019 A | 8/1994 | |
| JP | H07-251438 A | 10/1995 | |
| JP | H08-090570 A | 4/1996 | |
| JP | H08-281817 A | 10/1996 | |
| JP | 2587510 B2 | 3/1997 | |
| JP | 2962459 B2 | 10/1999 | |
| JP | 2000006351 A | 1/2000 | |
| JP | 2003-340918 A | 12/2003 | |
| JP | 2004-323663 A | 11/2004 | |
| JP | 2005-297405 | 10/2005 | |
| JP | 2006-001185 | 1/2006 | |
| JP | 2006-249159 | 9/2006 | |
| JP | 3896324 B2 | 3/2007 | |
| JP | 2007-092036 | 4/2007 | |
| JP | 2007092036 A | 4/2007 | |
| JP | 2007-126578 A | 5/2007 | |
| JP | 2007-217579 A | 8/2007 | |
| JP | 2007203702 A | 8/2007 | |
| JP | 4091209 B2 | 5/2008 | |
| JP | 2008-221488 A | 9/2008 | |
| JP | 2008-291168 A | 12/2008 | |
| JP | 2010-076295 A | 4/2010 | |
| JP | 2011-5803 A | 1/2011 | |
| JP | 2011054945 A | 3/2011 | |
| JP | 2011071815 A | 4/2011 | |
| JP | 2011-216598 A | 10/2011 | |
| JP | 2012089608 A | 5/2012 | |
| JP | 2012-167224 A | 9/2012 | |
| JP | 2012-186453 A | 9/2012 | |
| JP | 2012169598 A | 9/2012 | |
| JP | 2013158935 A | 8/2013 | |
| JP | 2014060449 A | 4/2014 | |
| JP | 2015066910 A | 4/2015 | |
| JP | 2015077783 A | 4/2015 | |
| JP | 2016107505 | 6/2016 | |
| JP | 2016129949 A | 7/2016 | |
| JP | 2016131193 A | 7/2016 | |
| JP | 2017-031442 A | 2/2017 | |
| JP | 2017-135216 A | 8/2017 | |
| JP | 2017189894 A | 10/2017 | |
| JP | 6277576 B2 | 2/2018 | |
| JP | 2018-121085 A | 8/2018 | |
| JP | 2018-172785 A | 11/2018 | |
| JP | 2018172790 A | 11/2018 | |
| JP | 2019-043980 A | 3/2019 | |
| JP | 2019117414 A * | 7/2019 | B05D 5/06 |
| JP | 2019123255 A | 7/2019 | |
| JP | 2019152853 A * | 9/2019 | B32B 7/12 |
| JP | 2022508617 A | 1/2022 | |
| KR | 1020050043649 A | 5/2005 | |
| KR | 10-2009-0077767 A | 7/2009 | |
| KR | 20110103068 A * | 9/2011 | |
| KR | 10-2012-0074230 A | 7/2012 | |
| KR | 20160065942 | 6/2016 | |
| KR | 10-2017-0103835 A | 9/2017 | |
| TW | 201417646 A | 5/2014 | |
| TW | 201533280 A | 9/2015 | |
| TW | 201928029 A | 7/2019 | |
| TW | 201939077 A | 10/2019 | |
| TW | 201941933 A | 11/2019 | |
| TW | I697549 B | 7/2020 | |
| WO | 2010139053 A1 | 12/2010 | |
| WO | 2011111826 A1 | 9/2011 | |
| WO | 2011118449 A1 | 9/2011 | |
| WO | 2012/117850 A1 | 9/2012 | |
| WO | 2014046014 A1 | 3/2014 | |
| WO | 2016104420 A | 6/2016 | |
| WO | WO2016136537 A | 9/2016 | |
| WO | 2016194964 A | 12/2016 | |
| WO | 2018/181223 A1 | 10/2018 | |
| WO | WO2018181222 A1 | 10/2018 | |
| WO | 2020009230 A1 | 1/2020 | |
| WO | 2020149324 A1 | 7/2020 | |
| WO | 2021256491 A1 | 12/2021 | |

OTHER PUBLICATIONS

Taiwan Examination Report of related TW 109117530.
Taiwan Notice of Allowance of related TW 109117530.
Japan Statement of Opposition of related JP 6804673.
Korea Statement of Opposition of related KR 10-2197515.
Author Misumi Co., title: Misumi-vona technical report, URL:https://jp.misumi-ec.com/tech-info/categories/technical_data/td01/g0103.html (upload date: Mar. 6, 2021).
Examination Report of JP2020-210267.
Examination Report of JP2020-210276.
Third Party Observation of JP2020-210276.
Notice of Panel Decision from Pre-Appeal Brief Review of U.S. Appl. No. 16/748,846.
Examination Report of KR10-2020-0180055.
Examination Report of KR10-2020-0180073.
Vlachopoulos J., Polychronopoulos N.D., Tanifuji S., Peter Müller J. (2012).
Examiner's Answer to Appeal Brief of U.S. Appl. No. 16/748,846.
Notice of Allowance of JP2020-210267.
Notice of Cancellation Grounds of KR10-2020-0044558.
Third Party Observation of KR10-2020-0128117.
Third Party Observation of KR10-2020-0180073.
Examination Report of TW108147226.
Notice of Allowance of 108147226.
Notice of Allowance of KR10-2020-0044558.
Examination Report of JP2020-21487.
Notice of Allowance of JP2020-21487.
Examination Report of KR10-2020-0044558.
Convertech, 2001.
Patent Board Decision of U.S. Appl. No. 16/748,846.
Third Party Observation 1 of JP2020-166621.
Third Party Observation 2 of JP2020-166621.
Final Examination Report of JP2020-210276.
Third Party Observation of KR10-2020-1080090.
Notice of Allowance of KR10-2020-0180055.
Catalog of Fukuda Metal Foil & Powder Co., Ltd. (2015).
Technical Report of Panasonic Corporation (2011).
Evaluation of the strength of single lap joint by using geomertrical and adhesive color information (2015).
Web page for introduction of kurtosis.
Japanese dictionary Kojien 7th edition.
Technical Report of IEICE (1999).
Measures against molding defects in easy extrusion molding (1984).
Web page for Surface Roughness Measurement-Parameters.
The 26th Spring Lecture Meeting of the Electronics Packaging Society (2012).
IPAB Decision on Appeal of KR10-2020-0044558, Korean Patent Office.
Final Examination Report of KR10-2020-0180073, Korean Patent Office.
Resilience Brother "5G communication material—liquid crystal polymer LCP", Aug. 26, 2020, http://ppfocus.com.
Saharudin et al. "Quality of Surface Texture and Mechanical Properties of PLA and PA-Based Material Reinforced with Carbon Fibers Manufactured by FDM and CFF 3D Printing Technologies", Polymers, 2021 htt[://www.mdpi.com/journal/polymers.
Hong, "Recent Market and Application Development of Liquid Crystal Polymers", Aug. 15, 2003, ITIS Industry Information Service Network.
Wang "Synthesis and Self-assembled Nanostructures of Rectangular Liquid Crystals", Jun. 2007, National Chiao Tung University, Taiwan.
Examination Report of U.S. Appl. No. 16/748,846, USPTO.
Notice of Allowance of TW109144672.
Notice of Allowance of TW109144673.
Notice of Allowance of TW109144674.

(56) References Cited

OTHER PUBLICATIONS

Notice of Allowance for Appeal of JP2020-210276.
Examination Report of U.S. Appl. No. 17/126,446.
Examination Report of JP2020-210284.
Examination Report of U.S. Appl. No. 17/126,413.
Third Party Observation of JP2020-199487.
Examination Report of KR10-2020-0128117.
Third Party Observation of U.S. Appl. No. 17/502,213.
Examination Report of U.S. Appl. No. 17/502,213.
Final Examination Report of U.S. Appl. No. 16/748,846.
Technologies&Applications of LCP (2004).
Vecstar catalog (2012).
LCP material for LSI Mounting (1999).
6-hydroxy-2-naphthoic acid.
4-hydroxybenzoic acid.
Newly developed LCP film (2005).
Standard Test Method for Haze and Luminous Transmittance of Transparent Plastics (ASTM D1003-00).
NDH5000 Haze Meter Introduction.
Geometrical Product Specifications (JISB0601:2013).
Geometrical Product Specifications (JISB0601:2001).
U.S. Appl. No. 62/952,533.
The New Color Science Handbook.
5G loss insertion.
ASTM D1003-13.
Dielectric characteristic&appli of LCP.
Fukuda catalog.
JISK7136:2000.
JISK7361-1:1997.
JISK7375:2008.
Patent Application No. JP2020-105862.
Konica webpage.
Kuraray webpage.
LCP applied into LED.
Opposition 1 to JP2020-210267.
Opposition 2 to JP2020-210267.
Roughness webpage.
Tech&Appli of LCP.
Examination Report of JP2020-199487.
Examination Report of U.S. Appl. No. 17/126,431.
Notice of Allowance of U.S. Appl. No. 17/126,413.
Notice of Reason of Cancellation of JP2020-210267.
Notice of Allowance of KR10-2020-0128117.
Examination Report of KR10-2020-0180090.
Examination Report of CN202011494501.1.
Final Examination Report of US17/126,446.
Final Examination Report of KR10-2020-0180073.
Third Party Observation of JP2020-166621.
ULTRALAM3000 (May 10, 2011).
Rz, Rku, Ra of examples of JP2020-166621 (2021, 07, 01).
Nippon Fine Chemical-TT%.
LED light-color temperature(2019).
Insertion loss of common high frequency PCB.
Development of multilayer flex substrate with LCP film.
Analysis and comparison of the standard test methods (Nov. 20, 2005).
Email related to U.S. Appl. No. 17/012,105 received on Dec. 15, 2022 and its brief comment.
Email related to U.S. Appl. No. 17/126,413 received on Dec. 28, 2022 and its brief comment.
Examination Report of JP2020-166621.
Examination Report of U.S. Appl. No. 16/748,846.
Supplemental NOA of U.S. Appl. No. 17/126,413.
Third Party Observation of JP2020-210284.
About the mechanical and electrical properties of polyethylene, Jun. 12, 2018, Tokyo Electric Power Company Holdings, Inc.

\* cited by examiner

LIQUID CRYSTAL POLYMER FILM AND LAMINATE COMPRISING THE SAME

CROSS-REFERENCE TO RELATED APPLICATION

Pursuant to 35 U.S.C. § 119(e), this application claims the benefits of the priority to U.S. Provisional Patent Application No. 62/952,553, filed Dec. 23, 2019. The contents of the prior application are incorporated herein by its entirety.

BACKGROUND OF THE INVENTION

1. Field of the Invention

The present application relates to a polymer film for a laminate, more particularly to a liquid crystal polymer (LCP) film and a laminate comprising the same.

2. Description of the Prior Arts

The rapid development of mobile communication technology has pushed the telecom industry to actively develop the fifth generation mobile networks, abbreviated as 5G, so as to optimize the performances, such as the data transmission rate, the response time, and the system capacity, etc. of the fourth generation mobile networks (4G).

Since 5G communication technology uses high-frequency bands for signal transmission, the higher the frequency of the signal, the greater the insertion loss. In order to achieve signal transmission using high-frequency bands, it has been known that an LCP film with low moisture absorption and low dielectric properties can be chosen to replace a polyimide film (PI film) with hygroscopic and high dielectric properties and stacked with a metal foil to produce a laminate, so as to decrease the insertion loss at high frequency.

However, the interfacial adhesion between the LCP film and a metal foil of a laminate is generally insufficient, components on a circuit board are prone to be detached and thus subsequent lamination processes will be seriously adversely affected. With the advancement of the technology, the insertion loss of the laminate is also awaited to be reduced. Therefore, there is still a need to solve the problems of the insufficient peel strength between the LCP film and the metal foil as well as significant insertion loss of the conventional laminate.

SUMMARY OF THE INVENTION

In view of the foresaid problems, an objective of the present application is to enhance the peel strength between an LCP film and a metal foil as well as ensure that the laminate has low insertion loss.

To achieve the aforementioned objective, one aspect of the present application provides an LCP film. The LCP film has a first surface and a second surface opposite each other, and a Kurtosis (Rku) of the first surface is more than or equal to 3.0 and less than or equal to 60.0.

By controlling the Rku feature of the first surface of the LCP film, the adhesion of the LCP film stacked to the metal foil can be increased, thereby enhancing the peel strength between the LCP film and the metal foil and further avoiding the problems such as wire detachment during subsequent processing of a laminate. Moreover, said technical means also ensures that the laminate comprising such LCP film has low insertion loss.

In one of the embodiments, in addition to the first surface of the LCP film, the Rku of the second surface may also be more than or equal to 3.0 and less than or equal to 60.0. Accordingly, regardless of whether the LCP film of the present application is stacked to at least one metal foil through either or both of the first surface and the second surface, the LCP film can possess superior adhesion to the at least one metal foil, thereby enhancing the peel strength between the LCP film and the at least one metal foil under the condition that the laminate has low insertion loss.

In other words, applying the LCP film of the present application to a laminate makes the laminate particularly suitable for high-end 5G products.

Preferably, the Rku of the first surface of the LCP film of the present application may be more than or equal to 3.4 and less than or equal to 60.0. In one of the embodiments, the Rku of the first surface of the LCP film of the present application may be more than or equal to 3.4 and less than or equal to 59.9. In one of the embodiments, the Rku of the first surface and the Rku of the second surface of the LCP film of the present application may both fall within any of the aforementioned ranges. The Rku of the first surface and the Rku of the second surface of the LCP film of the present application may be the same or different as needed. In one of the embodiments, the Rku of the first surface and the Rku of the second surface of the LCP film of the present application are different.

Preferably, an arithmetic average roughness (Ra) of the first surface of the LCP film of the present application may be less than or equal to 0.09 micrometers (m). Herein, in addition to achievement of high peel strength between the LCP film and a metal foil, applying the LCP film to a laminate can further decrease the insertion loss, and thus the laminate comprising the LCP film is highly suitable for high-end 5G products. More preferably, the Ra of the first surface of the LCP film of the present application may be more than or equal to 0.02 μm and less than or equal to 0.09 μm; even more preferably, the Ra of the first surface may be more than or equal to 0.020 μm and less than or equal to 0.088 μm. By means of decreasing the Ra of the first surface of the LCP film, the insertion loss of the laminate comprising the LCP film is further reduced, so that the laminate is highly suitable for high-end 5G products. In one of the embodiments, the Ra of the first surface of the LCP film of the present application may be more than or equal to 0.04 μm and less than or equal to 0.09 μm. In one of the embodiments, the Ra of the first surface and the Ra of the second surface of the LCP film of the present application may both fall within any of the aforementioned ranges. The Ra of the first surface and the Ra of the second surface of the LCP film of the present application may be the same or different as needed. In one of the embodiments, the Ra of the first surface and the Ra of the second surface of the LCP film of the present application are different.

Preferably, a ten-point mean roughness (Rz) of the first surface of the LCP film may be less than or equal to 2.0 μm; more preferably, the Rz of the first surface of the LCP film of the present application may be less than or equal to 1.9 μm. In one of the embodiments, the Rz of the first surface of the LCP film of the present application may be more than or equal to 0.1 μm and less than or equal to 2.0 μm. Preferably, the Rz of the first surface of the LCP film may be more than or equal to 0.2 μm and less than or equal to 2.0 μm; more preferably, the Rz of the first surface of the LCP film of the present application may be more than or equal to 0.3 μm and less than or equal to 2.0 μm; even more preferably, the Rz of the first surface of the LCP film of the present application may be more than or equal to 0.3 μm and less than or equal to 1.9 μm. In one of the embodiments, the Rz of the first surface and the Rz of the second surface of the LCP film of the present application may both fall within any of the aforementioned ranges. The Rz of the first surface and the Rz of the second surface of the LCP film of the present application may be the same or different as needed. In one of the embodiments, the Rz of the first surface and the Rz of the second surface of the LCP film of the present application are different.

In accordance with the present application, the LCP film may be produced by an LCP resin, which is commercially available or made from conventional raw materials. In the present application, the LCP resin is not particularly restricted. For example, aromatic or aliphatic hydroxy compounds such as hydroquinone, resorcin, 2,6-naphthalenediol, ethanediol, 1,4-butanediol, and 1,6-hexanediol; aromatic or aliphatic dicarboxylic acids such as terephthalic acid, isophthalic acid, 2,6-naphthalenedicarboxylic acid, 2-chloroterephthalic acid, and adipic acid; aromatic hydroxy carboxylic acids such as 3-hydroxybenzoic acid, 4-hydroxybenzoic acid, 6-hydroxy-2-naphthalenecarboxylic acid, and 4'-hydroxy-4-biphenylcarboxylic acid; aromatic amine compounds such as p-phenylenediamine, 4,4'-diaminobiphenyl, naphthalene-2,6-diamine, 4-aminophenol, 4-amino-3-methylphenol, and 4-aminobenzoic acid may be used as raw materials to prepare the LCP resin, and the LCP resin is then used to prepare the LCP film of the present application. In one of the embodiments of the present application, 6-hydroxy-2-naphthalenecarboxylic acid, 4-hydroxybenzoic acid, and acetyl anhydride (also called acetic anhydride) may be chosen to obtain the LCP resin, which can be used to prepare the LCP film of the present application. In one of the embodiments, the melting point of the LCP resin may be about 250° C. to 360° C.

In one of the embodiments, a person having ordinary skill in the art may add additives such as, but not limited to, lubricants, antioxidants, electrical insulating agents, or fillers during preparation of the LCP film of the present application based on different needs. For example, the applicable additives may be, but are not limited to, polycarbonate, polyamide, polyphenylene sulfide, or polyetheretherketone.

In accordance with the present application, the thickness of the LCP film is not particularly restricted. For example, the thickness of the LCP film may be more than or equal to 10 μm and less than or equal to 500 μm; preferably, the thickness of the LCP film of the present application may be more than or equal to 10 μm and less than or equal to 300 μm; more preferably, the thickness of the LCP film of the present application may be more than or equal to 15 μm and less than or equal to 250 μm; even more preferably, the thickness of the LCP film of the present application may be more than or equal to 20 μm and less than or equal to 200 μm.

To achieve the aforementioned objective, another aspect of the present application also provides a laminate, which comprises a first metal foil and the LCP film. The first metal foil is disposed over the first surface of the LCP film. That is, the first metal foil in the laminate of the present application is stacked onto the first surface of the LCP film.

In one of the embodiments, the laminate of the present application may further comprise a second metal foil, which is disposed over the second surface of the LCP film. That is, the first metal foil in the laminate of the present application is stacked onto the first surface of the LCP film, and the second metal foil in said laminate is stacked onto the second surface of the LCP film. In this embodiment, when the Rku properties of both of the first surface and the second surface of the LCP film are controlled at the same time, the adhesion of the LCP film stacked onto the first metal foil and the adhesion of the LCP film stacked onto the second metal foil are both improved, and thus the peel strength between the LCP film and the first metal foil as well as the peel strength between the LCP film and the second metal foil are both enhanced. At the same time, the low insertion loss of the laminate is achieved.

In accordance with the present application, "stacking" is not limited to direct contact; further, it also includes indirect contact. For example, in one of the embodiments of the present application, the first metal foil in the laminate is stacked onto the first surface of the LCP film in a direct contact manner. In another embodiment of the present application, the first metal foil in the laminate is stacked onto the first surface of the LCP film in an indirect contact manner. Specifically, a connection layer may be disposed between the first metal foil and the first surface of the LCP film based on different needs, so that the first metal foil contacts the first surface of the LCP film via the connection layer. The material of the connection layer may be adjusted according to different needs. For example, the material of the connection layer may include nickel, cobalt, chromium, or alloys thereof to provide functions such as thermal resistance, chemical resistance, or electrical resistance. Similarly, the second metal foil in the laminate may also be stacked onto the second surface of the LCP film in a direct or indirect contact manner. In one of the embodiments of the present application, the stacking manner for the LCP film and the first metal foil and the one for the LCP film and the second metal foil may be the same. In another embodiment, the stacking manner for the LCP film and the first metal foil may be different from that for the LCP film and the second metal foil.

In accordance with the present application, the first metal foil and/or the second metal foil may be, but are not limited to, copper foil, gold foil, silver foil, nickel foil, aluminum foil, stainless steel foil, etc. In one of the embodiments, the first metal foil and the second metal foil are made of different materials. Preferably, the first metal foil and/or the second metal foil may be copper foil, so that the copper foil and the LCP film are stacked to form a copper clad laminate (CCL). In addition, the method of preparing the first metal foil and/or the second metal foil are not particularly restricted, as long as the methods do not violate the objective of the present application. For example, the metal foil may be produced by, but not limited to, a roll-to-roll method or an electrodeposition method.

In accordance with the present application, the thickness of the first metal foil and/or the second metal foil is not particularly restricted and can be adjusted based on different needs by a person having ordinary skill in the art. For example, in one of the embodiments, the thickness of the first metal foil and/or the second metal foil may independently be more than or equal to 1 μm and less than or equal to 200 μm; preferably, the thickness of the first metal foil and/or the second metal foil may independently be more than or equal to 1 μm and less than or equal to 40 μm; more preferably, the thickness of the first metal foil and/or the second metal foil may independently be more than or equal to 1 μm and less than or equal to 20 μm; even more preferably, the thickness of the first metal foil and/or the second metal foil may independently be more than or equal to 3 μm and less than or equal to 20 μm.

In accordance with the present application, surface treatment of the first metal foil and/or the second metal foil of the present application can be conducted based on different needs by a person having ordinary skill in the art. For example, the surface treatment may be selected from, but not limited to, roughening treatment, acid-base treatment, thermal treatment, degreasing treatment, ultraviolet irradiation treatment, corona discharge treatment, plasma treatment, primer coating treatment, etc.

In accordance with the present application, the roughness of the first metal foil and/or the second metal foil is not particularly restricted and can be adjusted according to different needs by a person having ordinary skill in the art. In one of the embodiments, the Rz of the first metal foil and/or the Rz of the second metal foil may independently be more than or equal to 0.1 μm and less than or equal to 2.0 μm; preferably, the Rz of the first metal foil and/or the Rz of the second metal foil may independently be more than or equal to 0.1 μm and less than or equal to 1.5 μm. In one of the embodiments, the Rz of the first metal foil and the Rz of the second metal foil may both fall within any of the aforementioned ranges. The Rz of the first metal foil and the Rz of the second metal foil may be the same or different as needed. In one of the embodiments, the Rz of the first metal foil and the Rz of the second metal foil are different.

In one of the embodiments, a third metal foil may be additionally provided based on different needs by a person having ordinary skill in the art. The third metal foil may be the same or different from the first metal foil and/or the second metal foil as needed. In one of the embodiments, the Rz of the third metal foil may fall within any of the aforementioned ranges of the Rz of the first metal foil and/or the Rz of the second metal foil. In one of the embodiments, the Rz of the first metal foil, the Rz of the second metal foil, and the Rz of the third metal foil are different.

Preferably, the first metal foil, the second metal foil, and/or the third metal foil may be low profile metal foil, such as low profile copper foil.

In one of the embodiments, the laminate may comprise multiple LCP films. Based on the premise of not violating the spirit of the present application, multiple LCP films of the present application and multiple metal foils, such as the foresaid first metal foil, second metal foil, and/or third metal foil, may be stacked based on different needs to produce a laminate having the multiple LCP films and the multiple metal foils by a person having ordinary skill in the art.

In the specification, the term "Kurtosis (Rku)" is defined according to JIS B 0601:2001, and the terms "arithmetic average roughness (Ra)" and "ten-point mean roughness (Rz)" are defined according to JIS B 0601:1994.

DETAILED DESCRIPTION OF THE PREFERRED EMBODIMENTS

Hereinafter, multiple preparation examples are provided to illustrate raw materials used to produce the LCP film of the present application. Multiple examples are further provided to illustrate the implementation of the LCP film and the laminate of the present application, while multiple comparative examples are provided as comparison. A person having ordinary skill in the art can easily realize the advantages and effects of the present application from the following examples and comparative examples. The descriptions proposed herein are just preferable embodiments for the purpose of illustrations only, not intended to limit the scope of the present application. Various modifications and variations could be made in order to practice or apply the present application without departing from the spirit and scope of the present application.

LCP Resin

Preparation Example 1: LCP Resin

A mixture of 6-hydroxy-2-naphthalenecarboxylic acid (540 g), 4-hydroxybenzoic acid (1071 g), acetyl anhydride (1086 g), sodium phosphite (1.3 g), and 1-methylimidazole (0.3 g) was charged into a 3-liter autoclave and stirred for acetylation at 160° C. for about 2 hours under nitrogen atmosphere at normal pressure. Subsequently, the mixture was heated to 320° C. at a rate of 30° C. per hour, and then under this temperature condition, the pressure was reduced slowly from 760 torr to equal to or less than 3 torr or below, and the temperature was increased from 320° C. to 340° C. Afterwards, the stirring power and the pressure were increased, and steps of discharging polymers, drawing strands, and cutting strands into pellets were conducted to obtain an LCP resin having a melting point about 278° C. and a viscosity about 45 Pa·s @300° C.

Preparation Example 2: LCP Resin

A mixture of 6-hydroxy-2-naphthalenecarboxylic acid (440 g), 4-hydroxybenzoic acid (1145 g), acetyl anhydride (1085 g), and sodium phosphite (1.3 g) was charged into a 3-liter autoclave and stirred for acetylation at 160° C. for about 2 hours under nitrogen atmosphere at normal pressure. Subsequently, the mixture was heated to 320° C. at a rate of 30° C. per hour, and then under this temperature condition, the pressure was reduced slowly from 760 torr to 3 torr or below, and the temperature was increased from 320° C. to 340° C. Afterwards, the stirring power and the pressure were increased, and steps of discharging polymers, drawing strands, and cutting strands into pellets were conducted to obtain an LCP resin having a melting point about 305° C. and a viscosity about 40 Pa·s @300° C.

LCP Film

Examples 1 to 12 and Comparative Examples 1 to 6: LCP Films

The LCP resin obtained from Preparation Examples 1 and 2 (PE1 and PE2) was used as raw materials to prepare LCP films of Examples 1 to 12 (E1 to E12) and Comparative Examples 1 to 6 (C1 to C6) by the methods described below.

First, the LCP resin was put into an extruder having a screw diameter of 27 millimeters (mm) (manufacturer: Leistritz, model: ZSE27) and heated to a temperature ranging from 300° C. to 320° C., and then extruded from a T-die of a width of 500 mm at a feeding speed ranging from 5.5 kilograms per hour (kg/hr) to 8.5 kg/hr. The LCP resin was then delivered to a space between two casting wheels, which were spaced from the T-die by about 5 mm to 20 mm and each had a temperature ranging from about 290° C. to 330° C. and a diameter ranging from about 35 centimeters (cm) to 45 cm, extruded with a force about 20 kilonewtons (kN) to 60 kN, and then transferred to a cooling wheel for cooling at room temperature, so as to obtain an LCP film having a thickness of 50 μm.

The processes of Examples 1 to 12 differ from those of Comparative Examples 1 to 6 in the kind of the LCP resin, the distance from the T-die to the surfaces of the casting wheels, the feeding speed, and the extrusion temperature. The parameters of Examples 1 to 12 and Comparative Examples 1 to 6 are respectively listed in Table 1 below.

TABLE 1 parameters of preparing LCP films of
Examples 1 to 12 and Comparative Examples 1 to 6

| Sample No. | LCP Resin | Distance from T-die to casting wheels (mm) | Feeding Speed (kg/hr) | Extrusion Temp. (° C.) |
|---|---|---|---|---|
| E1  | PE1 | 20 | 5.5 | 300 |
| E2  | PE1 | 20 | 5.5 | 305 |
| E3  | PE1 | 20 | 5.5 | 310 |
| E4  | PE2 | 20 | 7.5 | 310 |
| E5  | PE2 | 20 | 7.5 | 315 |
| E6  | PE2 | 20 | 7.5 | 320 |
| E7  | PE1 | 20 | 6.5 | 300 |
| E8  | PE1 | 20 | 6.5 | 305 |
| E9  | PE1 | 20 | 6.5 | 310 |
| E10 | PE2 | 20 | 8.5 | 310 |
| E11 | PE2 | 20 | 8.5 | 315 |
| E12 | PE2 | 20 | 8.5 | 320 |
| C1  | PE1 | 10 | 6.0 | 290 |
| C2  | PE1 | 5  | 7.0 | 320 |
| C3  | PE1 | 10 | 5.5 | 290 |
| C4  | PE2 | 10 | 7.5 | 305 |
| C5  | PE1 | 5  | 6.5 | 320 |
| C6  | PE2 | 5  | 8.5 | 330 |

The above-mentioned preparation method of LCP film is only used to exemplify implementation of the present application. A person having ordinary skill in the art may adopt conventional methods such as a laminate extension method and an inflation method to prepare an LCP film.

In one of the embodiments, after the LCP resin was extruded from the T-die, the LCP resin might be delivered with two high-temperature resistant films to a space between two casting wheels to form a three-layered laminate based on needs by a person having ordinary skill in the art. The two high-temperature resistant films were detached from the LCP resin at room temperature to obtain the LCP film of the present application. The high-temperature resistant film may be selected from, but not limited to, poly(tetrafluoroethene) (PTFE) film, polyimide (PI) film, and poly(ether sulfone) (PES) film.

In addition, post treatments for the obtained LCP film may be conducted based on different needs by a person having ordinary skill in the art. The post treatments may be, but are not limited to, polishing, ultraviolet irradiation, plasma, etc. For the plasma treatment, it may be applied with a plasma operated with a power of 1 kilowatt (kW) under nitrogen, oxygen, or air atmosphere at a reduced or normal pressure based on different needs, but is not limited thereto.

Test Example 1: Rku, Ra, and Rz of LCP Films

In this test example, the LCP films of Examples 1 to 12 and Comparative Examples 1 to 6 were used as test samples. Rku of the surface of each test sample was measured according to JIS B 0601:2001, and Ra and Rz of the surface of each test sample were measured according to JIS B 0601:1994.

In order to measure Rku, Ra, and Rz of the either surface of each test sample, the surface morphology images of the test samples were taken by using a laser confocal scanning microscope (manufacturer: Olympus, model: LEXT OLS5000-SAF, objective lens: MPLAPON-50xLEXT) with an objective lens having a magnification power of 50×, 1× optical zoom, and a 405 nanometers (nm) wavelength of light source at a temperature of 24±3° C. and a relative humidity of 63±3%. Rku of the test samples were measured with a selection of an evaluation length of 4 mm, a high-pass filter of cutoff value ($\lambda c$) of 0.8 mm, a low-pass filter of cutoff value ($\lambda s$) of 2.5 µm, a resolution of 1024 pixels×1024 pixels, and a mode of auto tilt removal. Ra and Rz of the test samples were measured with a selection of an evaluation length of 4 mm and a cutoff value of 0.8 mm.

According to the foresaid method, the results of Rku, Ra, and Rz of either surface of each of the LCP films of Examples 1 to 12 and Comparative Examples 1 to 6 are listed in Table 2 below.

Examples 1A to 12A and Comparative Examples 1A to 6A: Laminates

Laminates of Examples 1A to 12A (E1A to E12A) and Comparative Examples 1A to 6A (C1A to C6A) were respectively produced from the LCP films of Examples 1 to 12 and Comparative Examples 1 to 6 stacked to the commercially available copper foils. The product descriptions of the commercially available copper foils are provided as follows:

Copper Foil 1: CF-T49A-HD2, purchased from FUKUDA METAL FOIL & POWDER CO., LTD., Rz: about 1.2 µm; and Copper Foil 2: CF-H9A-HD2, purchased from FUKUDA METAL FOIL & POWDER CO., LTD., Rz: about 1.0 µm.

The kind of the LCP film and the kind of the copper foil used for each of the laminates of Examples 1A to 12A and Comparative Examples 1A to 6A were listed in Table 2, and each of the laminates was produced as follows.

The LCP film having a thickness about 50 µm and two identical copper foils each having a thickness about 12 µm were each first cut to a size of 20 cm×20 cm. The LCP film was then sandwiched between the two commercially available copper foils to form a laminated structure. The laminated structure was subjected to a pressure of 5 kilograms per square centimeter (kg/cm$^2$) for 60 seconds at 180° C., followed by a pressure of 20 kg/cm$^2$ for 25 minutes (min) at 300° C., and then cooled to room temperature to obtain a laminate.

Herein, the lamination method for the laminates is not particularly restricted. A person having ordinary skill in the art may use conventional techniques such as a wire lamination or a surface lamination to conduct the lamination process. A laminator applicable to the present application may be, but is not limited to, an intermittent hot-press machine, a roll-to-roll wheeling machine, a double belt press machine, etc. According to different needs, a person having ordinary skill in the art can also align the LCP film with the copper foils to form a laminated structure, which may then be processed with surface lamination comprising a heating step and a pressing step.

In another embodiment, a metal foil, such as a copper foil, on an LCP film may be formed through sputtering, electroplating, chemical plating, evaporation deposition, etc. based on different needs by a person having ordinary skill in the art. Or, a connection layer, such as a glue layer, a nickel layer, a cobalt layer, a chromium layer, or an alloy layer thereof, may be formed between an LCP film and a metal foil based on different needs by a person having ordinary skill in the art.

Test Example 2: Peel Strength of Laminates

The peel strength of the laminates was measured according to IPC-TM-650 No.: 2.4.9. The laminates of Examples 1A to 12A and Comparative Examples 1A to 6A were each cut to a size of a length about 228.6 mm and a width about 3.2 mm as etched specimens. Each etched specimen was placed at a temperature of 23±2° C. and a relative humidity of 50±5% for 24 hours to reach stabilization. Subsequently, each etched specimen was adhered to a clamp of a testing machine (manufacturer: Hung Ta Instrument Co., Ltd., model: HT-9102) with a double faced adhesive tape. Each etched specimen was then peeled from the clamp with a force at a peel speed of 50.8 mm/min, and the value of the force during the peeling process was continuously recorded. Herein, the force should be controlled within a range of 15% to 85% of the bearable force of the testing machine, the peeling distance from the clamp should be at least more than 57.2 mm, and the force for the initial distance of 6.4 mm was neglected and not recorded. The results are shown in Table 2.

Test Example 3: Insertion Loss of Laminates

The laminates of Examples 1A to 12A and Comparative Examples 1A to 6A were each cut to a size of a length about 100 mm, a width about 140 mm, and a resistance about 50 Ohm (Ω) as strip line specimens. The insertion loss of the strip line specimens was measured under 10 GHz by a microwave network analyzer (manufacturer: Agilent Technologies, Ltd., model: 8722ES) including a probe (manufacturer: Cascade Microtech, model: ACP40-250). The results of the laminates are listed in Table 2 below.

Table 2: the results of surface roughness of LCP films of Examples 1 to 12 and Comparative Examples 1 to 6 and the copper foils used for laminates as well as the peel strength and insertion loss of the laminates of Examples 1A to 12A and Comparative Examples 1A to 6A.

| | LCP Film | | | | Laminate | | |
|---|---|---|---|---|---|---|---|
| Sample No. | Rku | Ra (µm) | Rz (µm) | Sample No. | Copper Foil No. | Peel Strength (kN/m) | Insertion Loss |
| E1 | 34.507 | 0.051 | 0.856 | E1A | Copper Foil 1 | 0.68 | −3.0 |
| E2 | 14.291 | 0.038 | 0.647 | E2A | Copper Foil 1 | 0.60 | −2.9 |
| E3 | 3.449 | 0.033 | 0.302 | E3A | Copper Foil 1 | 0.52 | −2.9 |
| E4 | 52.629 | 0.081 | 1.626 | E4A | Copper Foil 1 | 0.72 | −3.0 |
| E5 | 21.020 | 0.054 | 0.734 | E5A | Copper Foil 1 | 0.63 | −2.9 |
| E6 | 9.417 | 0.029 | 0.506 | E6A | Copper Foil 1 | 0.60 | −2.9 |
| E7 | 31.534 | 0.057 | 0.864 | E7A | Copper Foil 2 | 1.40 | −2.9 |
| E8 | 21.540 | 0.045 | 0.609 | E8A | Copper Foil 2 | 1.38 | −2.9 |
| E9 | 8.689 | 0.037 | 0.391 | E9A | Copper Foil 2 | 1.26 | −2.9 |
| E10 | 59.877 | 0.087 | 1.886 | E10A | Copper Foil 2 | 1.44 | −3.0 |
| E11 | 21.330 | 0.056 | 0.735 | E11A | Copper Foil 2 | 1.38 | −2.9 |
| E12 | 10.599 | 0.036 | 0.390 | E12A | Copper Foil 2 | 1.30 | −2.9 |
| C1 | 74.526 | 0.128 | 2.568 | C1A | Copper Foil 1 | 0.89 | −3.1 |
| C2 | 2.898 | 0.046 | 0.423 | C2A | Copper Foil 1 | 0.43 | −2.9 |
| C3 | 69.860 | 0.113 | 2.362 | C3A | Copper Foil 2 | 1.42 | −3.1 |
| C4 | 86.328 | 0.133 | 2.859 | C4A | Copper Foil 2 | 1.43 | −3.1 |
| C5 | 2.569 | 0.038 | 0.386 | C5A | Copper Foil 2 | 0.96 | −2.9 |
| C6 | 2.837 | 0.042 | 0.412 | C6A | Copper Foil 2 | 1.02 | −2.9 |

Discussion on Test Results

It should be understood for one having ordinary skill in the art that the results of the laminates would be compared with those of the laminates having the same type of copper foil to determine the influence of the LCP film on the performance of the laminates, so that the beneficial effects of the laminates are attributed to the LCP films and the LCP films being useful for optimizing the performance of the laminates can be confirmed.

As shown in Table 2 above, the Rku of either surface of the LCP film of each of Examples 1 to 12 was controlled within the range of more than or equal to 3.0 and less than or equal to 60.0, so the laminates of Examples 1A to 12A, which were produced from such LCP films and various commercially available copper foils, all exhibited high peel strength and low insertion loss. In contrast, the Rku of either surface of the LCP film of each of Comparative Examples 1 to 6 was out of the foresaid range, so the laminates of Comparative Examples 1A to 6A failed to possess high peel strength as well as low insertion loss.

The results of the multiple laminates having Copper Foil 1 were compared and analyzed. When the Rku of the LCP film, such as Comparative Example 1, was over 60.0, the produced laminate, such as Comparative Example 1A, yielded significant insertion loss; on the other hand, when the Rku of the LCP film, such as Comparative Example 2, was less than 3.0, the produced laminate, such as Comparative Example 2A, obviously had insufficient peel strength. In contrast, when the Rku of the LCP film, such as Examples 1 to 6, was controlled within the range of more than or equal to 3.0 and less than or equal to 60.0, the laminate, such as Examples 1A to 6A, not only exhibited improved peel strength between the LCP film and the metal foil but also had low insertion loss.

Even if different copper foils were used, the LCP film of the present application still provided the laminate with improved peel strength and low insertion loss. Specifically, the results of the multiple laminates having Copper Foil 2 were compared and analyzed. In comparison with the results of the laminates without using the claimed LCP film, such as Comparatives 3A to 6A, the LCP film having the Rku within a range of 3.0 to 60.0, such as Examples 7 to 12, allowed the laminate, such as Examples 7A to 12A, to exhibit improved peel strength as well as low insertion loss.

In summary, by controlling the Rku of the first surface of the LCP film to be more than or equal to 3.0 and less than or equal to 60.0, the laminate not only has improved peel strength between the LCP film and the metal foil but also exhibits low insertion loss. Therefore, the laminate of the present application is highly suitable for high-end 5G products.

Even though numerous characteristics and advantages of the present application have been set forth in the foregoing description, together with details of the structure and features of the present application, the disclosure is illustrative only. Changes may be made in the details, especially in matters of shape, size, and arrangement of parts within the principles of the present application to the full extent indicated by the broad general meaning of the terms in which the appended claims are expressed.

What is claimed is:

1. A liquid crystal polymer film, comprising a first surface and a second surface opposite each other, wherein a Kurtosis (Rku) of the first surface is more than or equal to 3.0 and less than or equal to 60.0; wherein an Rku of the second surface is more than or equal to 3.0 and less than or equal to 60.0; wherein the liquid crystal polymer film is used for a laminate; wherein the Rku is defined according to JIS B 0601: 2001.

2. The liquid crystal polymer film as claimed in claim 1, wherein the Rku of the first surface is more than or equal to 3.4 and less than or equal to 60.0.

3. The liquid crystal polymer film as claimed in claim 1, wherein an arithmetic average roughness of the first surface is less than or equal to 0.09 μm.

4. The liquid crystal polymer film as claimed in claim 3, wherein the arithmetic average roughness of the first surface is more than or equal to 0.02 μm and less than or equal to 0.09 μm.

5. The liquid crystal polymer film as claimed in claim 1, wherein a ten-point mean roughness of the first surface is less than or equal to 2.0 μm.

6. The liquid crystal polymer film as claimed in claim 5, wherein the ten-point mean roughness of the first surface is more than or equal to 0.1 μm and less than or equal to 2.0 μm.

7. The liquid crystal polymer film as claimed in claim 1, wherein an arithmetic average roughness of the second surface is less than or equal to 0.09 μm.

8. The liquid crystal polymer film as claimed in claim 3, wherein an arithmetic average roughness of the second surface is less than or equal to 0.09 μm.

9. The liquid crystal polymer film as claimed in claim 5, wherein an arithmetic average roughness of the second surface is less than or equal to 0.09 μm.

10. The liquid crystal polymer film as claimed in claim 1, wherein a ten-point mean roughness of the second surface is less than or equal to 2.0 μm.

11. The liquid crystal polymer film as claimed in claim 3, wherein a ten-point mean roughness of the second surface is less than or equal to 2.0 μm.

12. The liquid crystal polymer film as claimed in claim 5, wherein a ten-point mean roughness of the second surface is less than or equal to 2.0 μm.

13. A laminate, comprising a first metal foil and the liquid crystal polymer film as claimed in claim 1, the first metal foil disposed over the first surface of the liquid crystal polymer film.

14. The laminate as claimed in claim 13, wherein the laminate comprises a second metal foil, and the second metal foil is disposed over the second surface of the liquid crystal polymer film.

* * * * *